US008436431B2

(12) United States Patent
Takemura

(10) Patent No.: US 8,436,431 B2
(45) Date of Patent: May 7, 2013

(54) SEMICONDUCTOR DEVICE INCLUDING GATE AND THREE CONDUCTOR ELECTRODES

(75) Inventor: Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 157 days.

(21) Appl. No.: 13/014,060

(22) Filed: Jan. 26, 2011

(65) Prior Publication Data

US 2011/0193182 A1  Aug. 11, 2011

(30) Foreign Application Priority Data

Feb. 5, 2010 (JP) ................... 2010-024580

(51) Int. Cl.
*H01L 29/78* (2006.01)
(52) U.S. Cl.
USPC ............... 257/412; 257/288; 257/E29.255; 257/E21.41; 438/149
(58) Field of Classification Search .............. 257/288, 257/412, E29.255, E21.41; 438/149
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |

(Continued)

FOREIGN PATENT DOCUMENTS

| EP | 1737044 A | 12/2006 |
| EP | 1770788 A | 4/2007 |

(Continued)

OTHER PUBLICATIONS

International Search Report (Application No. PCT/JP2011/051143) Dated Apr. 26, 2011.

(Continued)

*Primary Examiner* — Thanh V Pham
(74) *Attorney, Agent, or Firm* — Eric J. Robinson; Robinson Intellectual Property Law Office, P.C.

(57) ABSTRACT

An object is to provide a field effect transistor (FET) having a conductor-semiconductor junction, which has excellent characteristics, which can be manufactured through an easy process, or which enables high integration. Owing to the junction between a semiconductor layer and a conductor having a work function lower than the electron affinity of the semiconductor layer, a region into which carriers are injected from the conductor is formed in the semiconductor layer. Such a region is used as an offset region of the FET or a resistor of a semiconductor circuit such as an inverter. Further, in the case of setting up such an offset region and a resistor in one semiconductor layer, an integrated semiconductor device can be manufactured.

9 Claims, 6 Drawing Sheets

U.S. PATENT DOCUMENTS

| | | | |
|---|---|---|---|
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,110,436 B2 | 2/2012 | Hayashi et al. |
| 8,188,480 B2 | 5/2012 | Itai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0108518 A1 | 5/2007 | Endo et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0062441 A1 | 3/2011 | Yabuta et al. |
| 2011/0104851 A1 | 5/2011 | Akimoto et al. |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2105967 A | 9/2009 |
| EP | 2226847 A | 9/2010 |
| JP | 56-115558 A | 9/1981 |
| JP | 58-122774 A | 7/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-079277 A | 3/2005 |
| JP | 2007-123861 A | 5/2007 |
| JP | 2007-142041 A | 6/2007 |
| JP | 2008-311342 A | 12/2008 |
| JP | 2009-099953 A | 5/2009 |
| JP | 2009-231613 A | 10/2009 |
| JP | 2009-276387 A | 11/2009 |
| JP | 2010-016126 A | 1/2010 |
| JP | 2010-021170 A | 1/2010 |
| JP | 2010-028021 A | 2/2010 |
| WO | WO-2004/114391 | 12/2004 |
| WO | WO-2009/041713 | 4/2009 |
| WO | WO-2009/139483 | 11/2009 |

OTHER PUBLICATIONS

Written Opinion (Application No. PCT/JP2011/051143) Dated Apr. 26, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters); Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Pappers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceeedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M., "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-A2O3-BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42,3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

PRIOR ART

US 8,436,431 B2

SEMICONDUCTOR DEVICE INCLUDING GATE AND THREE CONDUCTOR ELECTRODES

TECHNICAL FIELD

The present invention relates to a field effect transistor (FET) including a semiconductor and a semiconductor device including a field effect transistor.

BACKGROUND ART

A field effect transistor (FET) is a device in which regions called a source and a drain are provided in a semiconductor, in which each of the regions is provided with an electrode, potentials are supplied to the electrodes, and an electric field is applied to the semiconductor with the use of an electrode called a gate through an insulating film or a Schottky barrier so that the state of the semiconductor is controlled, whereby current flowing between the source and the drain is controlled. As the semiconductor, Group IV elements (Group 14 elements) such as silicon and germanium, Group III-V compounds such as gallium arsenide, indium phosphide, and gallium nitride, Group II-VI compounds such as zinc sulfide and cadmium telluride, and the like can be given.

In recent years, FETs in which an oxide such as zinc oxide or an indium gallium zinc oxide-based compound is used as a semiconductor have been reported (Patent Document 1 and Patent Document 2). In an FET including such an oxide semiconductor, relatively high mobility can be obtained, and such a material has a wide bandgap of greater than or equal to 3 electron volts; therefore, application of the FET including an oxide semiconductor to displays, power devices, and the like is discussed.

The fact that the bandgap of such a material is greater than or equal to 3 electron volts means that the material transmits visible light, for example; thus, in the case where the material is used in a display, even an FET portion can transmit light and the aperture ratio is expected to be improved.

Further, such a wide bandgap is common to silicon carbide, which is used in power devices; therefore, the oxide semiconductor is also expected to be applied to a power device.

Furthermore, a wide bandgap means few thermally excited carriers. For example, silicon has a bandgap of 1.1 electron volts at room temperature and thus thermally excited carriers exist therein at approximately $10^{11}/cm^3$, while in a semiconductor with a bandgap of 3.2 electron volts, thermally excited carriers exist at approximately $10^{-7}/cm^3$ according to calculation.

In the case of silicon, carriers generated by thermal excitation exist as described above even in silicon including no impurities, and thus the resistivity of the silicon cannot be higher than or equal to $10^5$ Ωcm. In contrast, in the case of the semiconductor with a bandgap of 3.2 electron volts, a resistivity of higher than or equal to $10^{20}$ Ωcm can be obtained in theory. When an FET is manufactured using such a semiconductor and its high resistivity in an off state (a state where the potential of a gate is the same as the potential of a source) is utilized, it is expected that electric charge can be retained semipermanently.

Meanwhile, there are few reports on an oxide semiconductor which includes zinc or indium in particular and has p-type conductivity. Accordingly, an FET using a PN junction like an FET of silicon has not been reported, and a conductor-semiconductor junction as disclosed in Patent Document 1 and Patent Document 2, where a conductor electrode is in contact with an n-type oxide semiconductor, has been used for forming a source or a drain.

Note that in general academic books about semiconductors, the "conductor-semiconductor junction" is expressed as a "metal-semiconductor junction." In this case, metal means a conductor. For example, a semiconductor which is doped at a high concentration and whose resistivity is significantly lowered, metal nitrides such as titanium nitride and tungsten nitride, metal oxides such as indium tin oxide and aluminum zinc oxide, and the like are also regarded as metal in "metal-semiconductor junctions." However, the term "metal" might generally cause misunderstanding; therefore, the term "conductor-semiconductor junction" is used instead of the term "metal-semiconductor junction" in this specification.

For example, Patent Document 1 discloses an FET like the one illustrated in FIG. 5A, that is, an FET in which a first conductor electrode 103$a$ called a source electrode and a second conductor electrode 103$b$ called a drain electrode are provided in contact with one surface of a semiconductor layer 102 and a gate 105 is provided on the other surface side of the semiconductor layer 102 with a gate insulating film 104 interposed therebetween. Conductors are used for the first conductor electrode 103$a$, the second conductor electrode 103$b$, and the gate 105.

The gate 105 needs to have a portion overlapping with the first conductor electrode 103$a$ and a portion overlapping with the second conductor electrode 103$b$, as shown by a width c in FIG. 5A. In other words, it is necessary in Patent Document 1 that c is larger than zero.

In an FET where a source electrode and a drain electrode are formed with the use of a conductor-semiconductor junction, when the carrier concentration of the semiconductor is high, current (off-state current) flows between the source electrode and the drain electrode even in an off state. Thus, the off-state current needs to be reduced by lowering the concentration of a donor or an acceptor in the semiconductor so that an i-type semiconductor (in this specification, an i-type semiconductor is a semiconductor whose carrier concentration derived from a donor or an acceptor is lower than or equal to $10^{12}/cm^3$) is obtained.

Note that a concentration of a donor (or an acceptor) in this specification is a concentration of an element, a chemical group, or the like which could be a donor (or an acceptor) multiplied by an ionization rate thereof. For example, in the case where a donor element is included at 2% and the ionization rate thereof is 0.005%, the donor concentration is 1 ppm (=0.02×0.00005).

By the way, in a semiconductor circuit including an FET, especially in a semiconductor circuit in which either a p-channel FET or an n-channel FET can be used, an inverter which is one of fundamental circuits has a structure in which a resistor is connected in series with an FET as illustrated in FIG. 6A.

Alternatively, in some cases, the inverter may have a structure in which two FETs are connected in series and a short circuit between a drain and a gate of one of the FETs (typically, the one on the VH side) is caused so that a diode is formed, as illustrated in FIG. 6B. However, the inverter of FIG. 6B has a disadvantage in that a contact at a portion expressed by X in the drawing needs to be made in order to cause the short circuit between the drain and the gate of the FET and thereby high integration cannot be achieved.

In the inverter of the type of FIG. 6A, under the assumption that the resistance when the FET is on is $R_{ON}$ and the resistance when the FET is off is $R_{OFF}$, a resistor having a resistance value R which satisfies the relation, $R_{ON} \ll R \ll R_{OFF}$, is connected to the FET. Here, it is preferable that R is higher than $10R_{ON}$ and lower than $R_{OFF}/10$, and further preferable that R is higher than $100R_{ON}$ and lower than $R_{OFF}/100$.

In this type of inverter, if the input is High, a current flows through the resistor and the on-state FET. At this time, the resistance between the VH and the VL in the inverter is $R+R_{ON}$. If the relation, $R>>R_{ON}$, is satisfied, the resistance of the inverter can approximate to R. Accordingly, when the power supply voltage of the inverter is assumed to be Vdd, power consumption can be expressed as $Vdd^2/R$. Further, the output voltage can approximate to zero.

Even if the input is Low, a current flows through the resistor and the FET. At this time, the resistance of the inverter is $R+R_{OFF}$. If the relation, $R<<R_{OFF}$, is satisfied, the resistance of the inverter can approximate to $R_{OFF}$. Accordingly, power consumption of the inverter can be expressed as $Vdd^2/R_{OFF}$. Further, the output voltage can approximate to Vdd.

As is apparent from the above relations, when R and $R_{OFF}$ are large values, power consumption can be reduced. In addition, in terms of the output voltage, it is preferable that R has an intermediate value between $R_{ON}$ and $R_{OFF}$, and it is ideal that R is $(R_{ON} \times R_{OFF})^{1/2}$. Accordingly, it is preferable that $R_{OFF}/R_{ON}$ is a large value.

Among conventional semiconductor circuits, a circuit including an amorphous silicon FET is known as such a semiconductor circuit in which either a p-channel FET or an n-channel FET can be used.

In an inverter circuit including an amorphous silicon FET, n-type amorphous silicon is used for a resistor. The n-type amorphous silicon is used as a material of a source and a drain of an FET and part of the amorphous silicon is processed so as to be used as a resistor. Since the n-type amorphous silicon does not have a high resistivity, the size of the resistor is larger than that of the FET.

By the way, an FET in which the carrier concentration is reduced by using an intrinsic (i-type) semiconductor having a band gap of 2 electron volts or more has an extremely small off-state current, that is, an extremely high $R_{OFF}$ and also has a mobility that is significantly high as compared to that of amorphous silicon, that is, a low $R_{ON}$; thus, the value of $R_{OFF}/R_{ON}$ is larger than or equal to $10^{10}$. With such a large value of $R_{OFF}/R_{ON}$, the margin in forming or designing a resistor is increased.

However, in the FETs in which a conductor is directly in contact with a semiconductor as in Patent Document 1 and Patent Document 2, a material appropriate for a resistor cannot be found, unlike the case of the FET including amorphous silicon. In particular, an i-type semiconductor formed through reduction of the carrier concentration is considered as having an extremely high resistivity; therefore, usage of the i-type semiconductor for a resistor has not been assumed at all.

[REFERENCE]
[Patent Document]
[Patent Document 1] United States Published Patent Application No. 2005/0199879
[Patent Document 2] United States Published Patent Application No. 2007/0194379

DISCLOSURE OF INVENTION

It is an object of the present invention to provide an excellent FET, semiconductor device, or semiconductor circuit, or a manufacturing method thereof by devising the circuit design of the FET having a conductor-semiconductor junction as described above. Another object is to provide an FET or semiconductor device having excellent characteristics or a manufacturing method thereof by utilizing features of the conductor-semiconductor junction. Further, it is an object to provide an FET or semiconductor device which can be manufactured through an easy process or a manufacturing method thereof. Furthermore, another object is to provide an FET or semiconductor device with high integration or a manufacturing method thereof. The present invention achieves at least one of the above objects.

Before the present invention is described, terms used in this specification will be briefly explained. First, as for a source and a drain of a transistor in this specification, a terminal supplied with a higher potential is referred to as a drain and the other terminal is referred to as a source in an n-channel FET, and a terminal supplied with a lower potential is referred to as a drain and the other terminal is referred to as a source in a p-channel FET. In the case where the same potential is supplied to the two terminals, one of them is referred to as a source and the other is referred to as a drain.

Instead of the terms "source electrode" and "drain electrode", those portions are referred to as a "first conductor electrode" and a "second conductor electrode" in some cases. In such a case, the names are not interchanged between those portions depending on the potential level.

A first embodiment of the present invention is an FET including a semiconductor layer, a first conductor electrode and a second conductor electrode provided in contact with one surface of the semiconductor layer, and a gate provided on the other surface side of the semiconductor layer. An offset region is formed in at least one of a region between the first conductor electrode and the gate and a region between the second conductor electrode and the gate.

A second embodiment of the present invention is an FET including a semiconductor layer, a first conductor electrode and a second conductor electrode provided in contact with one surface of the semiconductor layer, and a gate provided over the same surface. An offset region is formed in at least one of a region between the first conductor electrode and the gate and a region between the second conductor electrode and the gate.

In the above-described first and second embodiments of the present invention, the width of the offset region is preferably more than or equal to 10 nm and less than or equal to 100 nm, further preferably more than or equal to 10 nm and less than or equal to 50 nm, and still further preferably more than or equal to 10 nm and less than or equal to 20 nm. In addition, the thickness of the semiconductor layer is preferably less than or equal to the width of the offset region and further preferably less than or equal to half of the width of the offset region. Moreover, the width of the gate is preferably more than or equal to the width of the offset region.

A third embodiment of the present invention is a semiconductor device including a semiconductor layer, a first conductor electrode, a second conductor electrode, and a third conductor electrode which are in contact with one surface of the semiconductor layer, and a gate provided on the other surface side of the semiconductor layer.

A fourth embodiment of the present invention is a semiconductor device including a semiconductor layer, a first conductor electrode, a second conductor electrode, and a third conductor electrode which are in contact with one surface of the semiconductor layer, and a gate provided over the same surface.

In the above first to fourth embodiments of the present invention, it is preferable that the portions of the first to third conductor electrodes, which are in contact with the semiconductor layer, have a work function of lower than the sum of the electron affinity of the semiconductor layer and 0.3 electron volts (i.e., the electron affinity+0.3 electron volts). Alternatively, it is preferable that ohmic junctions be formed between the first and second conductor electrodes and the semiconductor layer.

In the above-described first to fourth embodiments of the present invention, the work function of a portion that is the closest to the semiconductor layer in the gate is preferably higher than the sum of the electron affinity of the semiconductor layer and 0.6 electron volts (i.e., the electron affinity+ 0.6 electron volts). In addition, it is preferable that the semiconductor layer is an i-type semiconductor layer.

In the above-described first to fourth embodiments of the present invention, the FET or the semiconductor circuit may be provided over an appropriate substrate. In such a case, a structure in which the semiconductor layer is provided between the gate and the substrate or a structure in which the gate is provided between the semiconductor layer and the substrate may be employed.

As examples of a material of the substrate, a semiconductor such as single crystal silicon, insulators such as various kinds of glasses, quartz, sapphire, and various types of ceramics, and conductors such as aluminum, stainless steel, and copper can be given. In the case where a semiconductor or a conductor is used as a substrate, it is preferable that an insulating layer is provided on a surface of the substrate.

Furthermore, a gate insulating film may be provided between the semiconductor layer and the gate. Alternatively, a Schottky barrier junction may be formed between the semiconductor layer and the gate. In addition, it is not necessary that the first to third conductor electrodes are all formed using the same material. Each of the first to third conductor electrodes may be formed using different materials, or two of them may be formed using the same material.

Note that the kind of the semiconductor layer is not limited to an oxide, and a Group II-VI compound such as a sulfide may be used. In addition, to reduce carriers generated by thermal excitation as described above, the bandgap of the semiconductor is preferably greater than or equal to 2 electron volts and less than 4 electron volts, further preferably greater than or equal to 2.9 electron volts and less than 3.5 electron volts.

At least one of the above objects can be achieved by employing any of the above-described structures. In the present invention, an appropriate resistance region is formed by utilizing properties of the conductor-semiconductor junction and the resistance region is utilized to form an offset region of an FET, a semiconductor circuit, or a semiconductor device.

In the FETs as disclosed in Patent Document 1 and Patent Document 2, the source electrode, the drain electrode, and the gate are formed of conductors. However, an influence of the conductor on a semiconductor has not been fully considered so far.

In this respect, it is found out from the consideration of the present inventor that in the case where the work function of a conductor is lower than the electron affinity of a semiconductor layer in the conductor-semiconductor junction, electrons flow into the semiconductor layer and thereby an ohmic junction is formed.

In an FET, since it is preferable that a junction between a source electrode and a semiconductor or between a drain electrode and the semiconductor be formed so that current flows easily, a material of the source electrode or the drain electrode is selected so that an ohmic junction is formed. For example, titanium and titanium nitride are given. When a junction between an electrode and a semiconductor is an ohmic junction, there are advantages of stable characteristics of an FET to be obtained and of high percentage of non-defective products.

In such a conductor-semiconductor junction, the concentration of electrons is higher in a region closer to the conductor and is roughly calculated to be $10^{20}/cm^3$ in several nanometers, $10^{18}/cm^3$ in several tens of nanometers, $10^{16}/cm^3$ in several hundreds of nanometers, $10^{14}/cm^3$ even in several micrometers from the interface of the conductor-semiconductor junction. That is, even if the semiconductor itself is intrinsic (i-type), a region having a high carrier concentration is formed by the contact with the conductor. Formation of such a region including many carriers in the vicinity of the interface of the conductor-semiconductor junction can make the conductor-semiconductor junction an ohmic junction.

Further, it is also made clear that when a conductor having an electron affinity higher than the work function of the semiconductor layer is used as a material of the gate, the gate can have a function of eliminating electrons in the semiconductor. For example, tungsten and platinum can be given as examples of the material of the gate. It is found out that the off-state current can be made extremely small when using such a gate material.

On the basis of the above consideration, a conceptual distribution of the carrier concentration in the semiconductor layer 102 of the FET illustrated in FIG. 5A in the case where the first conductor electrode 103a, the second conductor electrode 103b, and the gate 105 have the same potential is illustrated in FIG. 5B. Here, assuming that the work function of each of the first conductor electrode 103a and the second conductor electrode 103b is $W_m$, the work function of the gate 105 is $W_g$, and the electron affinity of the semiconductor layer 102 is $\phi$, the following conditions are satisfied: $W_m < \phi + 0.3$ electron volts, $W_g > \phi + 0.6$ electron volts.

As illustrated in FIG. 5B, electrons are injected from the first conductor electrode 103a and the second conductor electrode 103b, and a region 102a having an extremely high electron concentration is formed in the vicinity of the first conductor electrode 103a and the second conductor electrode 103b. In a portion close to the gate 105, a region 102e having an extremely low electron concentration is formed. Between the region 102a and the region 102e, the concentration of electrons is lower in a portion that is more apart from the first conductor electrode 103a and the second conductor electrode 103b or in a region closer to the gate 105.

FIG. 5B shows that the concentration of electrons in a region 102b is lower than that in the region 102a by approximately an order of magnitude, the concentration of electrons in a region 102c is lower than that in the region 102b by approximately an order of magnitude, and the concentration of electrons in a region 102d is lower than that in the region 102c by approximately an order of magnitude. As the concentration of electrons is increased, the conductivity is increased. On the other hand, as the concentration of electrons is decreased, the conductivity is decreased. For example, the semiconductor layer 102 in the region 102e is an insulator.

The off-state current of the FET illustrated in FIG. 5B is determined by the region 102e which is formed in a middle area between the first conductor electrode 103a and the second conductor electrode 103b. Meanwhile, it is found that the portion where the first conductor electrode 103a and the gate 105 overlap with each other, the portion where the second conductor electrode 103b and the gate 105 overlap with each other, and a peripheral region of the portions have little influence on the reduction of the off-state current.

If the distance between the first conductor electrode 103a and the second conductor electrode 103b is reduced in the FET illustrated in FIG. 5A, the region 102e is narrowed and the region having a higher concentration of electrons than the region 102e is widened. This state is not favorable because the off-state current is increased. Therefore, a certain value of the distance needs to be assured between the first conductor electrode 103a and the second conductor electrode 103b in order to make an off-state current smaller than or equal to a certain value.

The present inventor has noticed that the distribution of the concentration of electrons as illustrated in FIG. 5B can also be obtained with a structure other than the structure of FIG. 5A, for example, with a structure as illustrated in FIG. 1A. In the FET having the structure of FIG. 1A, the first conductor electrode 103a and the second conductor electrode 103b are provided so as not to overlap with the gate 105. In FIG. 1A, an offset region having a width d is provided between the first conductor electrode 103a and the gate 105.

The FET illustrated in FIG. 1A may be provided over a substrate of an appropriate material. In such a case, the substrate may be positioned over the gate 105 or below the first conductor electrode 103a in the drawing.

Normally, such an offset region has the same effect as the case of connecting a resistor in series with an FET. However, according to the consideration of the present inventor, it is found that even when such an offset region is provided, the influence on the operation of the FET is little as long as d is 100 nm or less, preferably 50 nm or less, and further preferably 20 nm or less.

This is because electrons flow into the semiconductor layer 102 from the first conductor electrode 103a and the second conductor electrode 103b as described above and thereby a portion having a high concentration of electrons (e.g., the region 102c) is formed even in the offset region. In the case of an n-channel FET, when a positive potential is applied to the gate 105, a portion directly below the offset region in the region 102e and the region 102d in FIG. 1B becomes a region having a high concentration of electrons, and a path connecting the first conductor electrode 103a with the second conductor electrode 103b is formed.

With such a structure, parasitic capacitance between the gate 105 and the first conductor electrode 103a and between the gate 105 and the second conductor electrode 103b can be sufficiently reduced. In order to enjoy this effect, the width d of the offset region is preferably 10 nm or more. When the width d of the offset region is less than 10 nm, parasitic capacitance between the gate 105 and the first conductor electrode 103a or between the gate 105 and the second conductor electrode 103b is significantly increased.

In the FET illustrated in FIG. 1A, the first conductor electrode 103a and the second conductor electrode 103b are provided on the surface different from the surface provided with the gate 105. An FET in which the first conductor electrode 103a and the second conductor electrode 103b are provided on the same surface that is provided with the gate 105 can also be manufactured.

FIG. 1C illustrates an FET in which the first conductor electrode 103a, the second conductor electrode 103b, the gate insulating film 104, and the gate 105 are provided on the same surface of the semiconductor layer 102. Offset regions are provided between the gate 105 and the first conductor electrode 103a and between the gate 105 and the second conductor electrode 103b.

The semiconductor layer 102 is in contact with the first conductor electrode 103a and the second conductor electrode 103b, whereby supply of electrons is caused; thus, regions having various concentrations of electrons are formed as illustrated in FIG. 1C. The distribution of the concentration of electrons is slightly different from that of FIG. 1B since the first conductor electrode 103a and the second conductor electrode 103b are provided on the same surface that is provided with the gate 105.

In the structure of FIG. 1C, the influence of the first conductor electrode 103a and the second conductor electrode 103b is relatively reduced particularly on the opposite side from the gate in the semiconductor layer 102; accordingly, the concentration of electrons in that portion is reduced as compared to the structure of FIG. 1B. As a result, the off-state current is further reduced.

Since such an FET has a structure similar to that of a conventional silicon MOSFET, there are advantages in that a process such as multilayer wiring can be easily and simply carried out as compared to the structure of FIG. 1A and that higher integration can be achieved. Further, a doping process using ion implantation, which is necessary in the case of a conventional silicon MOSFET, is unnecessary in the structure of FIG. 1C. That is, a portion provided with the gate is automatically serves as a channel having an extremely low concentration of electrons, and the other portion corresponds to an extension region having moderate concentrations of electrons.

Electrons flow into the semiconductor layer 102 from the first conductor electrode 103a and the second conductor electrode 103b and the portion having moderate concentrations of electrons is formed, which means the portion having moderate concentrations of electrons has an intermediate resistance value between the resistance value of the on-state FET and the resistance value of the off-state FET.

Back to FIGS. 5A to 5C, a conceptual distribution of the concentration of carriers in the semiconductor layer 102 in the case where the gate 105 is removed from the FET of FIG. 5A is illustrated in FIG. 5C. In this case, an effect of the gate that removes electrons cannot be obtained, and a region having a high concentration of electrons, which is wider than that of FIG. 5B, is formed due to electrons injected from the first conductor electrode 103a and the second conductor electrode 103b.

In consideration of the fact that the FET in FIG. 5B is in an off state and a region having a higher concentration of electrons is formed in large area in the semiconductor layer 102 due to the gate 105 in an on state of the FET, FIG. 5C illustrates an FET in the intermediate state between the on state and the off state.

The resistance value (the resistance value in the region between the first conductor electrode 103a and the second conductor electrode 103b) in this state also has an intermediate value between the resistance value of the on-state FET and the resistance value of the off-state FET. The resistance value is inversely proportional to the carrier concentration. The resistivity of the semiconductor layer in the element having a structure in which the gate 105 is removed from the FET of FIG. 5A (hereinafter referred to as a resistor element) is lower than the resistivity of the semiconductor layer in the off-state FET including the same-thickness semiconductor layer by three to eight orders of magnitude.

It is preferable to use such a resistor element as a resistor in the inverter illustrated in FIG. 6A as described above. In particular, when the distance L between the first conductor electrode 103a and the second conductor electrode 103b is more than or equal to 100 nm and less than or equal to 10 μm, the relation, $R_{ON} \ll R \ll R_{OFF}$, can be satisfied on the assumption of using the FET which has a channel length approximately the same as the distance L (a channel length more than or equal to ½ times of L and less than or equal to 5 times of L) and has the on-state resistance $R_{ON}$ and the off-state resistance $R_{OFF}$.

At this time, it is preferable that the channel width of the FET is more than or equal to 50% and less than or equal to 200% of the width of the resistor element and the thickness of the semiconductor layer of the FET is more than or equal to 50% and less than or equal to 200% of the thickness of the semiconductor layer of the resistor element. Needless to say, it is possible to satisfy the above relation under other conditions.

The work function of a conductor is discussed in the above description. The work function of a conductor may be a value determined by an interface with a semiconductor in a simplest assumption; however, a complex physical property such as generation of a compound of the semiconductor and the conductor due to chemical reaction or a trap of electric charge or another element is often observed at the interface in reality.

In the case where a first conductor layer with an extremely small thickness of less than or equal to several nanometers and a second conductor layer with a relatively large thickness are stacked over a semiconductor layer in this order, for example, the influence of the work function of the first conductor layer is considerably reduced. Therefore, in application of the present invention, the design may be performed so that the work function or the like of each material at a position that is 5 nm away from an interface with the semiconductor layer satisfies favorable conditions of the present invention.

The present invention is particularly effective for a semiconductor material in which substantially only one of an electron and a hole can be used as a carrier. In other words, a favorable result can be obtained in accordance with the present invention, for example, in the case where the mobility of one of the electron and the hole is higher than or equal to 1 $cm^2/Vs$ whereas the mobility of the other is lower than or equal to 0.01 $cm^2/Vs$, the other of the electron and the hole does not exist as a carrier, or the effective mass of the other of the electron and the hole is 100 times or more as large as that of a free electron.

BRIEF DESCRIPTION OF DRAWINGS

In the accompanying drawings.

BEST MODE FOR CARRYING OUT THE INVENTION

Figure 1A:
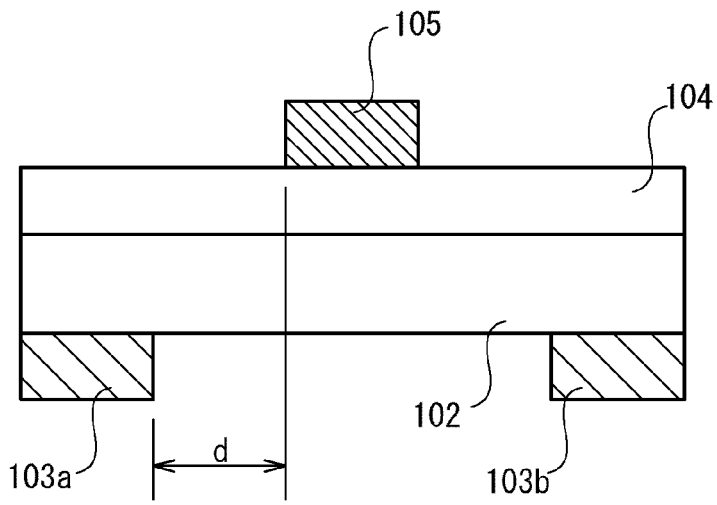
FIGS. 1A to 1C illustrate operation principles of field effect transistors of the present invention.

Hereinafter, embodiments will be described with reference to the drawings. Note that the embodiments can be implemented in various modes, and it is easily understood by those skilled in the art that modes and details can be changed in various ways without departing from the spirit and scope of the present invention. Therefore, the present invention is not construed as being limited to the description of the embodiments. Note that in structures described below, the same portions or portions having similar functions are denoted by the same reference numerals in different drawings, and detailed description thereof is not repeated.

(Embodiment 1)

Figure 2A:
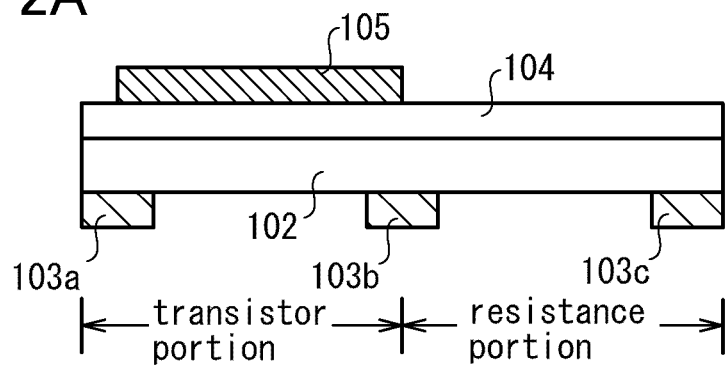
FIGS. 2A to 2C illustrate an example of a semiconductor circuit of the present invention.
Figure 2B:
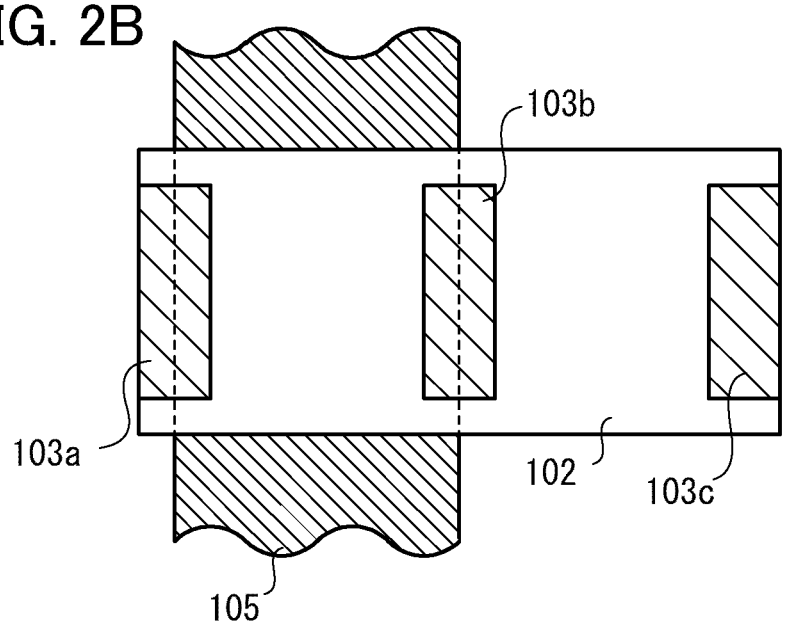

In this embodiment, a semiconductor circuit illustrated in FIGS. 2A to 2C will be described. FIG. 2A is a conceptual diagram illustrating a cross section of the semiconductor circuit, and FIG. 2B illustrates the semiconductor circuit of FIG. 2A seen from the bottom side. As illustrated in FIG. 2A, this semiconductor circuit includes a first conductor electrode 103a, a second conductor electrode 103b, and a third conductor electrode 103c which are in contact with one surface of a semiconductor layer 102. The other surface of the semiconductor layer 102 is provided with a gate 105. A gate insulating film 104 is provided between the gate 105 and the semiconductor layer 102.

A substrate may be provided either below the first conductor electrode 103a, the second conductor electrode 103b, and the third conductor electrode 103c or over the gate 105. The semiconductor layer 102 of this semiconductor circuit is generally rectangular as illustrated in FIG. 2B and provided with the first conductor electrode 103a, the second conductor electrode 103b, and the third conductor electrode 103c. In addition, it is preferable that the semiconductor layer 102 is formed of an i-type semiconductor, and the bandgap of the semiconductor is preferably greater than or equal to 2 electron volts and less than 4 electron volts, further preferably greater than or equal to 2.9 electron volts and less than 3.5 electron volts.

The gate 105 is provided so as to overlap with a region of the semiconductor layer 102 between the first conductor electrode 103a and the second conductor electrode 103b (the region does not include a portion overlapping with the first conductor electrode 103a and the second conductor electrode 103b) but so as not to overlap with a region of the semiconductor layer 102 between the second conductor electrode 103b and the third conductor electrode 103c (the region does not include a portion overlapping with the second conductor electrode 103b and the third conductor electrode 103c).

With such a structure, the first conductor electrode 103a, the second conductor electrode 103b, the gate 105, and a portion of the semiconductor layer 102 which is surrounded by the first conductor electrode 103a, the second conductor electrode 103b, and the gate 105 form an FET. In addition, the second conductor electrode 103b, the third conductor electrode 103c, and a portion of the semiconductor layer 102 between the second conductor electrode 103b and the third conductor electrode 103c form a resistor.

Figure 5A:
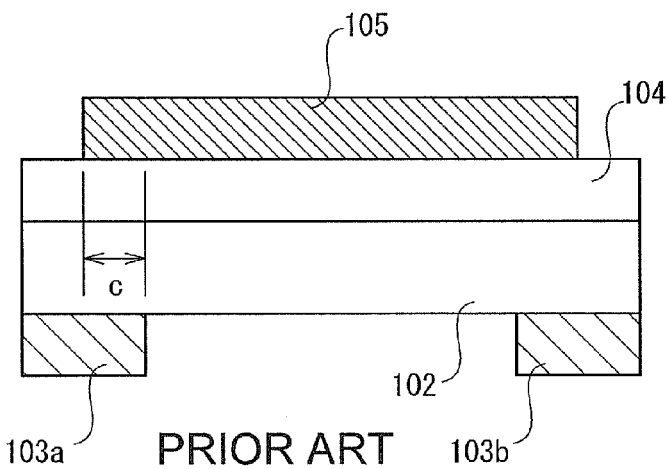
FIGS. 5A to 5C illustrate principles of the present invention.
Figure 5B:
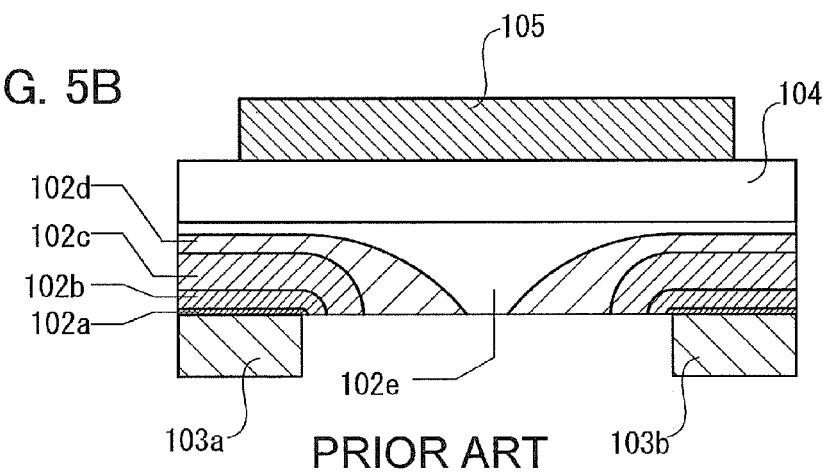
Figure 5C:
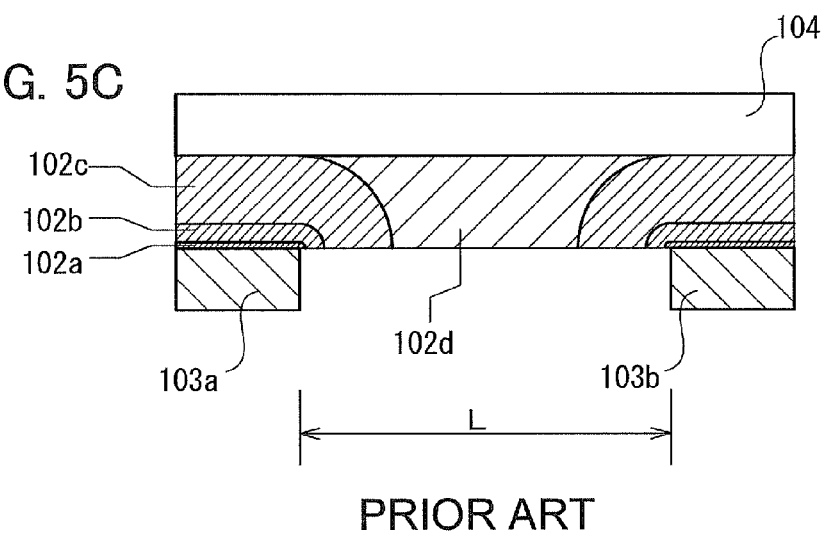
Figure 6A:
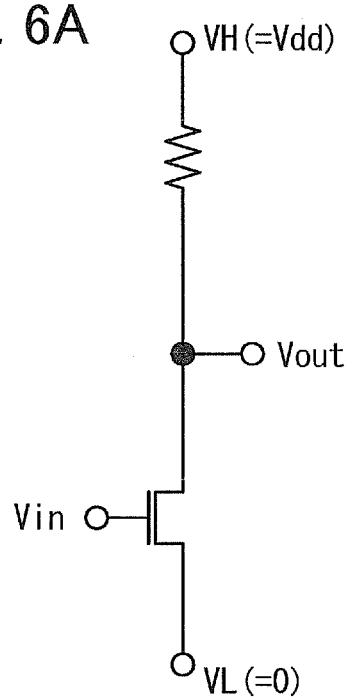
FIGS. 6A and 6B are circuit diagrams of conventional inverters.

In other words, as illustrated in FIG. 2A, the former functions as a transistor portion, and the latter functions as a resistance portion. The distributions of the concentration of electrons in the transistor portion and the resistance portion of the semiconductor layer 102 are almost the same as the distribution illustrated in FIG. 5B and the distribution illustrated in FIG. 5C, respectively. Accordingly, as illustrated in the circuit diagram of FIG. 2C, an inverter of the type of FIG. 6A is obtained.

Further, as illustrated in FIG. 2B, the length of the transistor portion in the channel width direction and the length of the resistance portion in a direction corresponding to the channel width direction are substantially the same. It is obvious from the following reason that the inverter having the structure of FIGS. 2A to 2C has higher integration than the inverter illustrated in FIG. 6B.

Figure 6B:
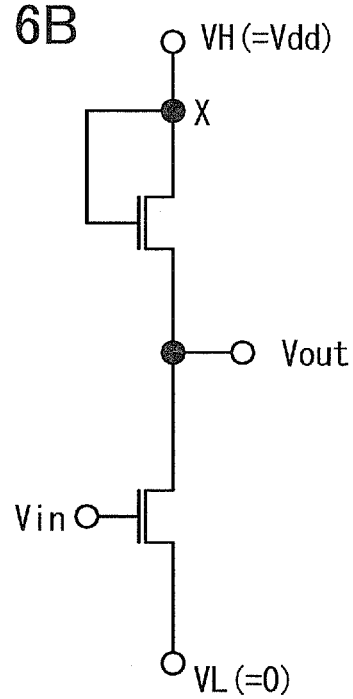

For example, in formation of the inverter of the type of FIG. 6B in a similar manner, a gate needs to be provided also between the second conductor electrode 103b and the third conductor electrode 103c. However, in order to ensure the insulation between the gate 105 and a gate adjacent to the gate 105, a distance more than or equal to the minimal processing line width needs to be set between the adjacent gates. As a result, the width of the second conductor electrode 103b needs to be large.

In FIGS. 2A and 2B, the minimal processing line width is a width of the first conductor electrode 103a, the second conductor electrode 103b, or the third conductor electrode 103c. Accordingly, in the inverter of the type of FIG. 6B, the width of the second conductor electrode 103b needs to be twice the width of that in FIGS. 2A and 2B. In contrast, in the inverter of the type of FIG. 6A, it is not necessary to provide a gate between the second conductor electrode 103b and the third conductor electrode 103c; accordingly, the width of the second conductor electrode 103b can be set to a minimal line width.

Figure 2C:
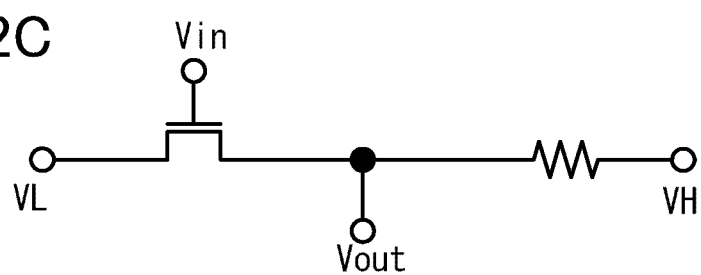

The semiconductor device as illustrated in FIGS. 2A to 2C may be manufactured in the following manner: the first conductor electrode 103a, the second conductor electrode 103b, and the third conductor electrode 103c are formed over a substrate and then the semiconductor layer 102, the gate insulating film 104, and the gate 105 are formed.

Alternatively, the following method may be employed: the gate 105 is formed over a substrate and then the gate insulating film 104, the semiconductor layer 102, the first conductor electrode 103a, the second conductor electrode 103b, and the third conductor electrode 103c are formed.

Note that although the distance between the first conductor electrode 103a and the second conductor electrode 103b is substantially the same as the distance between the second conductor electrode 103b and the third conductor electrode 103c in FIGS. 2A to 2C, the former distance may be set more than or less than the latter distance.

(Embodiment 2)

Figure 3A:
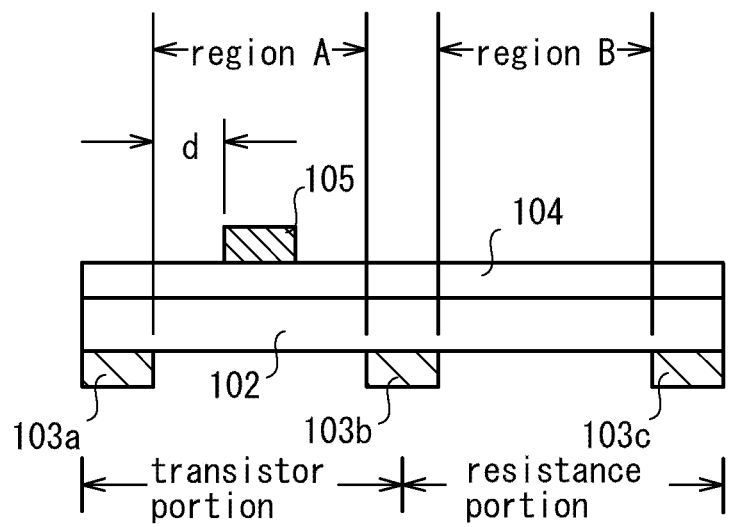
FIGS. 3A to 3C illustrate an example of a semiconductor circuit of the present invention.
Figure 3B:
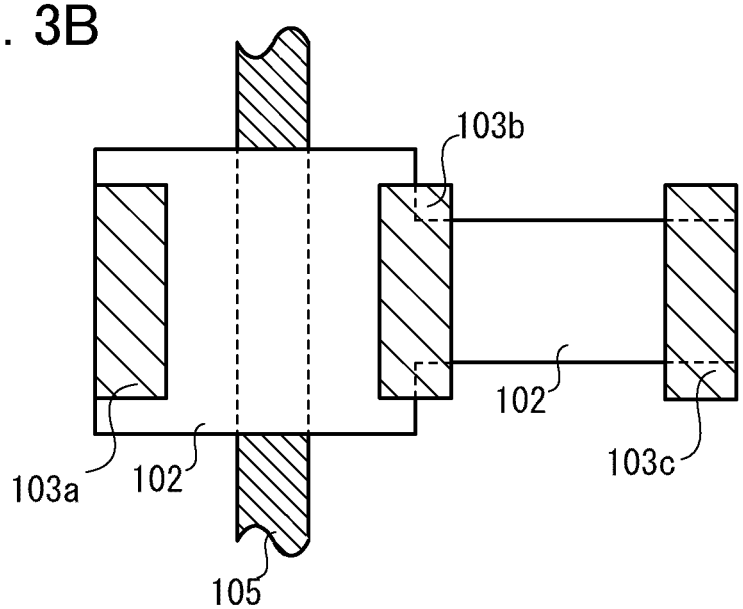
Figure 3C:
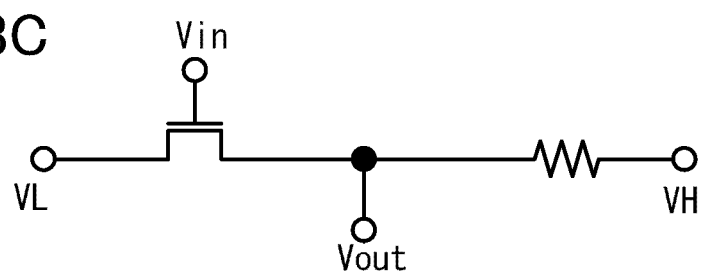

In this embodiment, a semiconductor circuit illustrated in FIGS. 3A to 3C will be described. FIG. 3A is a conceptual diagram illustrating a cross section of the semiconductor circuit, and FIG. 3B illustrates the semiconductor circuit of FIG. 3A seen from the bottom side. In a manner similar to that of the semiconductor device illustrated in FIGS. 2A to 2C, this semiconductor circuit includes a first conductor electrode 103a, a second conductor electrode 103b, and a third conductor electrode 103c which are in contact with one surface of a semiconductor layer 102, as illustrated in FIG. 3A. The other surface of the semiconductor layer 102 is provided with a gate 105. A gate insulating film 104 is provided between the gate 105 and the semiconductor layer 102. It is preferable that the semiconductor layer 102 is formed of an i-type semiconductor, and the bandgap of the semiconductor is preferably greater than or equal to 2 electron volts and less than 4 electron volts, further preferably greater than or equal to 2.9 electron volts and less than 3.5 electron volts.

The gate 105 is provided so as to overlap with at least part of a region A of the semiconductor layer 102 between the first conductor electrode 103a and the second conductor electrode 103b (the region A does not include a portion overlapping with the first conductor electrode 103a and the second conductor electrode 103b) but so as not to overlap with a region B of the semiconductor layer 102 between the second conductor electrode 103b and the third conductor electrode 103c (the region B does not include a portion overlapping with the second conductor electrode 103b and the third conductor electrode 103c).

A point different from that of the semiconductor device illustrated in FIGS. 2A to 2C is that the gate 105 overlaps with neither the first conductor electrode 103a nor the second conductor electrode 103b and offset regions are included. In other words, the offset regions having a length d are included between the gate 105 and the first conductor electrode 103 and between the gate 105 and the second conductor electrode 103b.

The semiconductor layer 102 of this semiconductor circuit has a complicated shape as illustrated in FIG. 3B. The semiconductor layer 102 has a wide width in the left part (in a portion including the region A) and a narrow width in the right part (in a portion including the region B). In this manner, the resistance in the right part is increased and the resistance ratio of the resistance in the right part with respect to the resistance in the left part is adjusted.

Also in this semiconductor device, in a manner similar to that of Embodiment 1, the first conductor electrode 103a, the second conductor electrode 103b, the gate 105, and a portion of the semiconductor layer 102 which is surrounded by the first conductor electrode 103a, the second conductor electrode 103b, and the gate 105 form an FET which is similar to that of FIG. 1A. In addition, the second conductor electrode 103b, the third conductor electrode 103c, and a portion of the semiconductor layer 102 between the second conductor electrode 103b and the third conductor electrode 103c form a resistor which is similar to that of FIG. 5C.

Figure 1B:
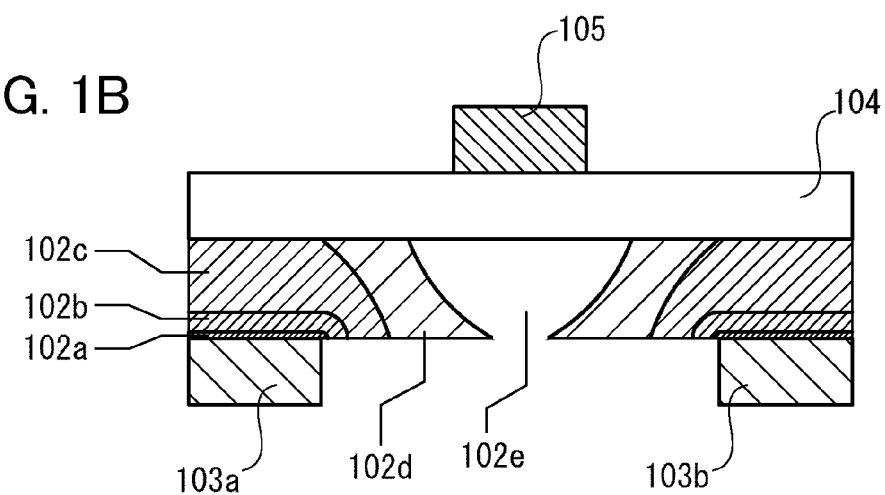
Figure 1C:
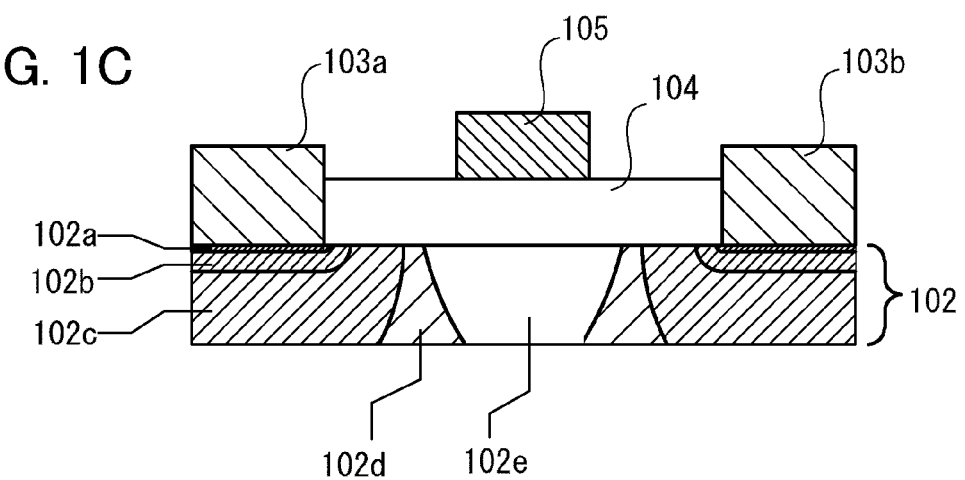

In other words, as illustrated in FIG. 3A, the former functions as a transistor portion, and the latter functions as a resistance portion. The distributions of the concentration of electrons in the transistor portion and the resistance portion of the semiconductor layer 102 are almost the same as the distribution illustrated in FIG. 1B and the distribution illustrated in FIG. 5C, respectively. The circuit diagram is illustrated in FIG. 3C. This semiconductor device can be used as the inverter illustrated in FIG. 6A. The resistance of the resistance portion of this semiconductor device is higher than that of Embodiment 1.

In the inverter of this embodiment, the resistance can be made high when the input of the transistor is Low; accordingly, power consumption can be reduced. In addition, for the same reason, a breakdown of an element due to a flow-through current can be prevented; accordingly, reliability can be increased.

By the way, in the case where an inverter of the type of FIG. 6B is manufactured using a FET including an offset region like the one described in this embodiment, the reduction in the degree of integration, which has been pointed out in Embodiment 1, can be overcome. In other words, due to the existence of the offset region, the distance between gates is more than the minimal line width. Accordingly, even in the case of forming the second conductor electrode 103b to have a minimal line width, a gate adjacent to the gate 105 can be provided between the second conductor electrode 103b and the third conductor electrode 103c.

However, since a contact between the gate and the conductor electrode needs to be obtained as described above, the degree of integration is reduced as compared to the type of FIG. 6A.

(Embodiment 3)

Figure 4A:
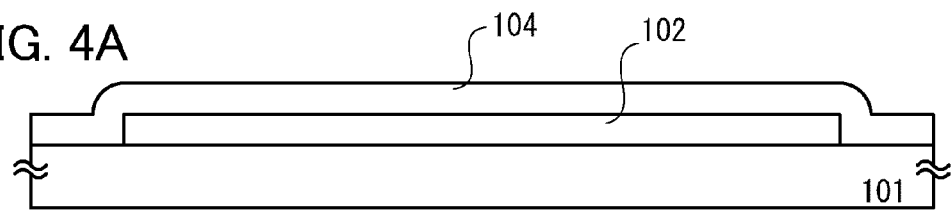
FIGS. 4A to 4D illustrate an example of a manufacturing process of a semiconductor circuit of the present invention.

In this embodiment, a manufacturing method of a semiconductor device will be described with reference to FIGS. 4A to 4D. First, as illustrated in FIG. 4A, a semiconductor layer 102 and a gate insulating film 104 are formed over a substrate 101. A variety of substrates can be given as examples of the substrate 101, but the substrate 101 needs to have such a property as to withstand the subsequent treatment. Further, it is preferable that a surface of the substrate 101 has an insulating property. Accordingly, the substrate 101 is preferably a single insulator; an insulator, metal, or semiconductor whose surface is provided with an insulating layer; or the like.

In the case of using an insulator for the substrate 101, various kinds of glasses, sapphire, quartz, ceramics, or the like can be used. In the case of using a metal, aluminum, copper, stainless steel, silver, or the like can be used. In the case of using a semiconductor, silicon, germanium, silicon carbide, gallium nitride, or the like can be used. In this embodiment, barium borosilicate glass is used as the substrate 101.

As a semiconductor material of the semiconductor layer 102, an oxide semiconductor including indium and zinc is used. Other than the above oxide semiconductor, a variety of oxide semiconductors can be used. In this embodiment, the semiconductor layer 102 is formed in the following manner: an indium zinc oxide film having a thickness of 30 nm is formed by a sputtering method using an oxide target including equal amounts of indium and zinc and then the film is patterned.

An insulating film formed by a sputtering method is used as the gate insulating film 104. As a material of the gate insulating film 104, silicon oxide, aluminum oxide, aluminum nitride, hafnium oxide, lanthanum oxide, yttrium oxide, or the like can be used. In this embodiment, aluminum oxide having a thickness of 100 nm is formed by a sputtering method as the gate insulating film 104.

Appropriate heat treatment is preferably performed either after formation of the semiconductor layer 102 or after formation of the gate insulating film 104 or at both of the timings. This heat treatment is for reducing the hydrogen concentration or oxygen vacancies in the semiconductor layer 102, and if possible, the heat treatment is preferably performed right after formation of the semiconductor layer 102.

In the heat treatment, it is preferable that heat treatment in a reducing atmosphere is initially performed and then heat treatment in an oxygen atmosphere is performed. In the initial heat treatment in a reducing atmosphere, hydrogen is efficiently released together with oxygen. In the next heat treatment in an oxygen atmosphere, oxygen vacancies can be reduced.

Figure 4B:
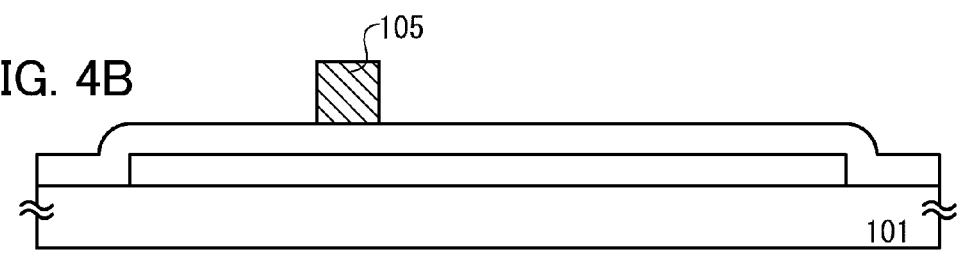

Then, a gate 105 is formed as illustrated in FIG. 4B. A material of the gate 105 can be a metal having a high work function such as platinum, gold, or tungsten. Alternatively, a compound having an electron affinity of 5 electron volts or more, such as indium nitride, may be used. The gate 105 may include a single material of any of the above-described materials or may have a multilayer structure where a portion in contact with the gate insulating film 104 includes any of the above-described materials. In this embodiment, a 100-nm-thick platinum film and a 100-nm-thick aluminum film are formed by a sputtering method and etched, so that the gate 105 is formed.

Figure 4C:
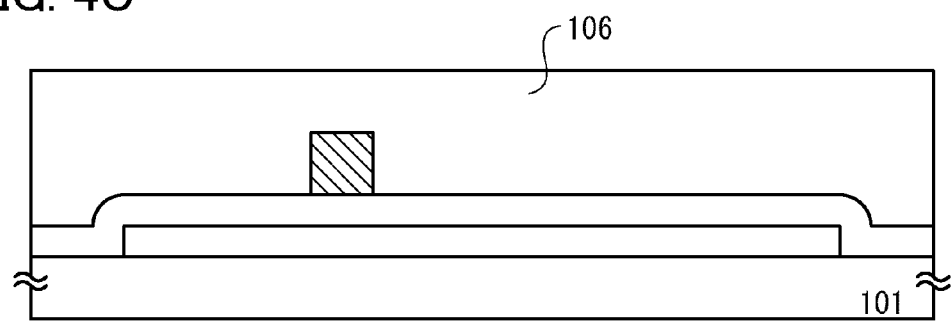

Further, an interlayer insulator 106 is formed by a sputtering method. The interlayer insulator 106 is preferably formed using a material having a low dielectric constant. In this embodiment, the interlayer insulator 106 is a silicon oxide film having a thickness of 300 nm formed by a CVD method. As illustrated in FIG. 4C, the interlayer insulator 106 is planarized by a chemical mechanical polishing (CMP) method.

Then, contact holes reaching the semiconductor layer 102 are formed, and a first conductor electrode 103a, a second conductor electrode 103b, and a third conductor electrode 103c are formed. In this embodiment, a 50-nm-thick titanium nitride film and a 150-nm-thick titanium film are successively formed by a sputtering method and patterned, so that the first conductor electrode 103a, the second conductor electrode 103b, and the third conductor electrode 103c are formed. In this manner, a semiconductor circuit illustrated in FIG. 4D is formed.

Figure 4D:
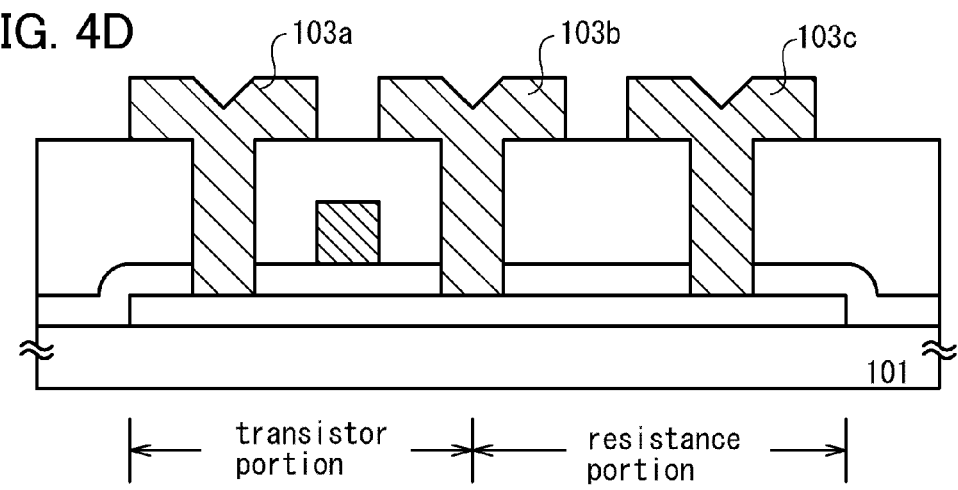

A portion on the left side of the semiconductor layer 102 in FIG. 4D, over which the gate 105 is formed, functions as an active layer of a FET, and a portion on the right side in FIG. 4D, over which the gate 105 is not provided, functions as a resistor. This circuit can be used as the inverter illustrated in FIG. 6A.

(Embodiment 4)

The semiconductor devices described in Embodiments 1 to 3 can be used in a variety of electronic devices, for example, in driver circuits for display devices such as liquid crystal displays, EL (electro luminescent) displays, and FE (field emission) displays, driver circuits for image sensors, semiconductor memories, and the like. Further, the semiconductor devices described in Embodiments 1 to 3 can be used in electronic devices including the above-described electronic devices, for example, in television sets, personal computers, communication devices such as mobile phones, electronic notebooks, portable music players, and the like.

This application is based on Japanese Patent Application serial no. 2010-024580 filed with Japan Patent Office on Feb. 5, 2010, the entire contents of which are hereby incorporated by reference.

The invention claimed is:

1. A semiconductor device comprising:
   a semiconductor layer;
   a first conductor electrode, a second conductor electrode, and a third conductor electrode which are provided in contact with one surface of the semiconductor layer; and
   a gate provided on the other surface side of the semiconductor layer,
   wherein the gate overlaps with at least part of a region between the first conductor electrode and the second conductor electrode, and
   wherein the gate does not overlap with a region between the second conductor electrode and the third conductor electrode.

2. The semiconductor device according to claim 1, wherein a portion of the first conductor electrode and a portion of the second conductor electrode which are in contact with the semiconductor layer have a work function lower than a sum of an electron affinity of the semiconductor layer and 0.3 electron volts.

3. The semiconductor device according to claim 1, wherein an ohmic junction is formed between the semiconductor layer and the first conductor electrode and between the semiconductor layer and the second conductor electrode.

4. The semiconductor device according to claim 1, further comprising a gate insulating film between the semiconductor layer and the gate.

5. The semiconductor device according to claim 1, wherein a work function of a portion of the gate which is the closest to the semiconductor layer is higher than a sum of an electron affinity of the semiconductor layer and 0.6 electron volts.

6. The semiconductor device according to claim 1, wherein a width of a first portion of the semiconductor layer between the first conductor electrode and the second conductor electrode is wider than that of a second portion of the semiconductor layer between the second conductor electrode and the third conductor electrode.

7. The semiconductor device according to claim 1, wherein the semiconductor layer comprises an i-type semiconductor.

8. The semiconductor device according to claim 1, wherein the gate comprises a material selected from the group consisting of platinum, gold, tungsten, and indium nitride.

9. The semiconductor device according to claim 1, wherein the semiconductor device is an inverter.

* * * * *